(12) United States Patent
Nendai

(10) Patent No.: US 8,421,344 B2
(45) Date of Patent: Apr. 16, 2013

(54) ORGANIC LIGHT EMITTING ELEMENT AND MANUFACTURING METHOD OF THE SAME, ORGANIC DISPLAY PANEL, AND ORGANIC DISPLAY DEVICE

(75) Inventor: Kenichi Nendai, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/167,974

(22) Filed: Jun. 24, 2011

(65) Prior Publication Data

US 2011/0316414 A1    Dec. 29, 2011

Related U.S. Application Data

(63) Continuation of application No. PCT/JP2010/004264, filed on Jun. 28, 2010.

(51) Int. Cl.
*H05B 33/00* (2006.01)

(52) U.S. Cl.
USPC .......................................... 313/504; 313/498

(58) Field of Classification Search .................... 313/504
See application file for complete search history.

(56) References Cited

U.S. PATENT DOCUMENTS

| | | | |
|---|---|---|---|
| 5,443,922 A | 8/1995 | Nishizaki et al. | |
| 2002/0053871 A1 | 5/2002 | Seo | |
| 2004/0245920 A1* | 12/2004 | Nakamura | 313/504 |
| 2005/0087884 A1* | 4/2005 | Stokes et al. | 257/778 |
| 2005/0170208 A1 | 8/2005 | Yatsunami et al. | |
| 2006/0022585 A1* | 2/2006 | Aziz | 313/504 |
| 2006/0063460 A1 | 3/2006 | Seo | |
| 2007/0057264 A1* | 3/2007 | Matsuda | 257/88 |
| 2007/0134510 A1 | 6/2007 | Vestweber et al. | |
| 2007/0222379 A1 | 9/2007 | Yamazaki et al. | |
| 2007/0241665 A1 | 10/2007 | Sakanoue et al. | |
| 2007/0290604 A1 | 12/2007 | Sakanoue et al. | |
| 2009/0160325 A1 | 6/2009 | Yatsunami et al. | |
| 2010/0102310 A1 | 4/2010 | Komatsu et al. | |
| 2011/0165517 A1 | 7/2011 | Nishiyama et al. | |

FOREIGN PATENT DOCUMENTS

| | | |
|---|---|---|
| JP | 5-163488 | 6/1993 |
| JP | 06-188074 | 7/1994 |
| JP | 10-308284 | 11/1998 |
| JP | 2002-203687 | 7/2002 |

(Continued)

OTHER PUBLICATIONS

International Search Report in PCT/JP2010/004264, dated Jul. 20, 2010.

(Continued)

*Primary Examiner* — Anh Mai
*Assistant Examiner* — Andrew Coughlin
(74) *Attorney, Agent, or Firm* — Greenblum & Bernstein, P.L.C.

(57) ABSTRACT

An organic light emitting element and method for manufacturing an organic light emitting element. A first electrode is formed from a metal alloy that includes a first metal material that exhibits a carrier-injection property upon oxidation, and a second metal material that is light-reflective and electrically conductive, a precipitate of the first metal material forming on at least part of a surface of the first electrode, and a metal oxide layer being formed in the precipitate. A functional layer contacts the surface of the first electrode and includes at least a light-emitting layer configured to accept a carrier injected by the first electrode. A second electrode is disposed opposite the first electrode with the functional layer therebetween and has a polarity different from a polarity of the first electrode.

16 Claims, 9 Drawing Sheets

FOREIGN PATENT DOCUMENTS

| | | |
|---|---|---|
| JP | 2005-203339 | 7/2005 |
| JP | 2006-005340 | 1/2006 |
| JP | 2007-149703 | 6/2007 |
| JP | 2007-522645 | 8/2007 |
| JP | 2007-288071 | 11/2007 |
| JP | 2008-041747 | 2/2008 |
| JP | 2010-135300 | 6/2010 |
| WO | 2009/087966 | 7/2009 |

OTHER PUBLICATIONS

Chan et al., "Enhanced hole injections in organic light-emitting devices by depositing nickel oxide on indium tin oxide anode", American Institute of Physics, Applied Physics Letter, vol. 81, No. 10, pp. 1899-1901 (Sep. 2, 2002).

* cited by examiner

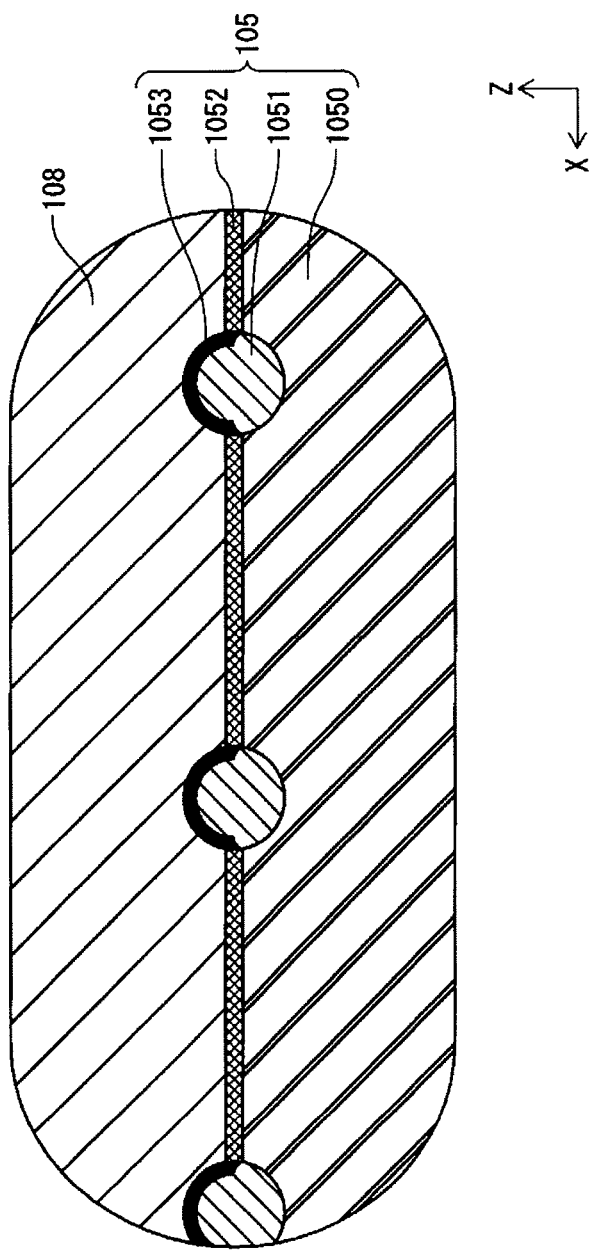

ORGANIC LIGHT EMITTING ELEMENT AND MANUFACTURING METHOD OF THE SAME, ORGANIC DISPLAY PANEL, AND ORGANIC DISPLAY DEVICE

CROSS REFERENCE TO RELATED APPLICATION

This is a continuation application of PCT Application No. PCT/JP2010/004264 filed Jun. 28, 2010, designating the United States of America, the disclosure of which, including the specification, drawings and claims, is incorporated herein by reference in its entirety.

BACKGROUND OF THE INVENTION

1. Field of the Invention

The present invention relates to organic light emitting elements and a manufacturing method of the same, organic display panels, and organic display devices.

2. Description of Related Art

In recent years, progress has been made in the research and development of organic electroluminescent elements (hereinafter, "organic EL elements"), which are light-emitting elements that rely on the phenomenon of electroluminescence of organic material. The structure of an organic EL panel that uses conventional organic EL elements is described with reference to FIG. 9.

As shown in FIG. 9, a thin-film transistor layer (hereinafter, "TFT layer") 901, passivation film 902, and planarizing film 903 are layered in this order above a substrate 900 in the organic EL panel. The TFT layer 901 is composed of a gate electrode 9011, drain electrode 9012, source electrode 9013, channel layer 9014, and gate insulation film 9015.

In this organic EL panel, an anode 905 and auxiliary electrode 906 are provided, with a space therebetween, along the surface of the planarizing film 903, and on each anode 905 and auxiliary electrode 906, a hole-injection layer 913 and a hole-injection layer 914 are respectively laminated. The portion of this organic EL panel in which the anode 905 is formed corresponds to a light emitting cell 90a, and the portion in which the auxiliary electrode 906 is formed corresponds to a non-light emitting portion 90b. Banks 907 are formed between light emitting cells 90a, as well as between a light emitting cell 90a and a non-light emitting portion 90b.

In the light emitting cell 90a in the organic EL panel, an interlayer 908, organic light emitting layer 909, electron transport layer 910, and cathode 911 are laminated in this order in a region defined by the banks 907. The electron transport layer 910 is formed continuously across adjacent light emitting cells 90a and non-light emitting portions 90b, passing over the banks 907, as is also the case with the cathode 911. In the non-light emitting portion 90b, the cathode 911 is connected to the auxiliary electrode 906 through the hole-injection layer 914 and electron transport layer 910 (the portion indicated by arrow C).

The cathode 911 in this organic EL panel is covered by a passivation layer 912.

Note that instead of using silver (Ag), a conventional material for forming the anode 905 and the auxiliary electrode 906, development and research is proceeding regarding the use of a metal alloy that includes aluminum, a less expensive metal.

Furthermore, technology to prevent intrusion of water or oxygen (Patent Literature 1) by using a non-crystalline transparent conductive film has been suggested, as has technology to form an oxide layer on the surface of the anode, via a technique such as electrolytic plating, and to have the oxide layer contact with the organic light emitting layer in order to achieve high luminous efficiency (Patent Literature 2).

It has also been suggested to use a metal oxide, such as a transition metal oxide, to form the hole-injection layers 913 and 914 (Patent Literature 3, 4). Hole-injection layers 913 and 914 formed with such a material have the advantages of excellent voltage-current density characteristics and of not deteriorating easily even when a high current flows to increase emission intensity.

3. Related Literature

Patent Literature 1: Japanese Patent Application Publication No. 2007-149703

Patent Literature 2: Japanese Patent Application Publication No. 2002-203687

Patent Literature 3: Japanese Patent Application Publication No. 2007-288071

Patent Literature 4: Japanese Patent Application Publication No. 2005-203339

SUMMARY OF THE INVENTION

However, as shown in FIG. 9, a conventional organic EL panel is formed with a large number of layers and is therefore expensive, which has led to demand for a further reduction in cost. Furthermore, the hole-injection layer 913 is affected by the accuracy of patterning of the anode 905. If the patterning is insufficient, it is hard to guarantee coverage, meaning that the hole-injection layer 913 may peel off, leading to a reduction in light-emitting characteristics.

In order to solve the above problems, it is an object of the present invention to provide an organic light emitting element that can be manufactured at low cost with excellent light-emitting characteristics and a manufacturing method of the same, as well as an organic display panel and organic display device that incorporate the organic light emitting element.

An organic light emitting element according to an aspect of the present invention comprises a first electrode formed from a metal alloy that includes a first metal material exhibiting carrier-injection properties upon oxidation and a second metal material that is light-reflective and electrically conductive, a precipitate of the first metal material having been caused to form on at least part of a surface of the first electrode, and a metal oxide layer having formed in the precipitate; a functional layer in contact with the surface of the first electrode and including at least a light-emitting layer configured to accept a carrier injected by the first electrode; and a second electrode disposed opposite the first electrode with the functional layer therebetween and having different polarity than the first electrode.

In the organic light emitting according to the above aspect of the present invention, a precipitate of the first metal material has been caused to form on at least part of a surface of the first electrode, and a metal oxide layer has formed in the precipitate. As described above, the first metal material included in the metal alloy composing the first electrode exhibits carrier-injection properties upon oxidation. Accordingly, the first electrode in the organic light emitting element according to the above aspect of the present invention has carrier-injection properties with respect to the functional layer, and therefore it is not necessary to form a separate carrier-injection layer on the first electrode. Omitting a carrier-injection layer on the first electrode reduces the total number of layers, which is advantageous in terms of cost.

Furthermore, in the organic light emitting element according to the above aspect of the present invention, a metal oxide layer formed on the first electrode and exhibiting carrier-injection properties not only makes it unnecessary to form a separate carrier-injection layer, as described above, but also avoids the problem of reduced light-emitting characteristics caused by the carrier-injection layer in the above conventional technology peeling off.

Accordingly, the organic light emitting element according to the above aspect of the present invention can be manufactured at low cost with excellent light-emitting characteristics.

BRIEF DESCRIPTION OF DRAWINGS

FIG. 4 is a schematic cross-section diagram showing an enlarged portion of a surface portion of the anode 105;

DETAILED DESCRIPTION OF THE INVENTION

Figure 1:
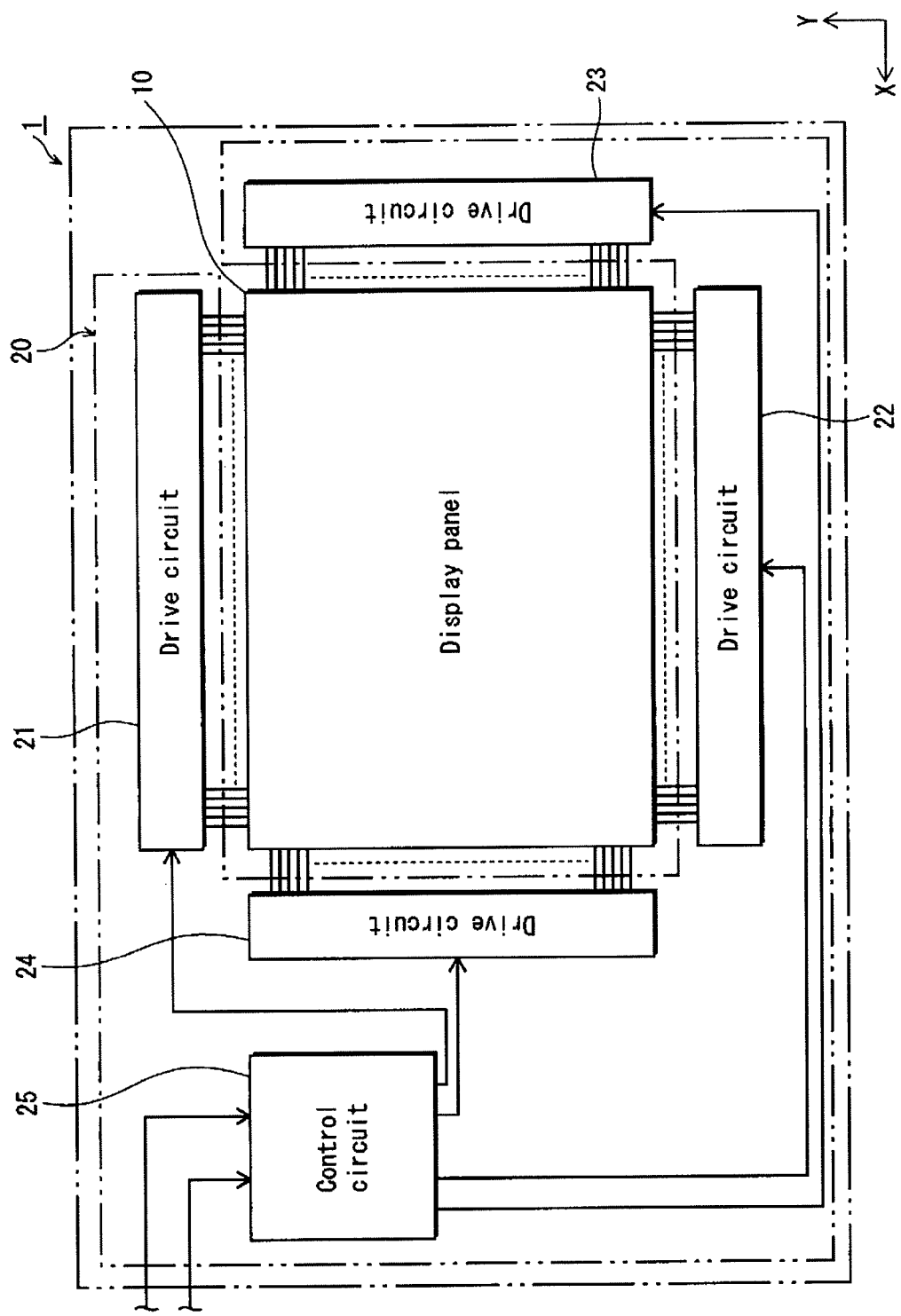
FIG. 1 is a block diagram showing the structure of an organic display device 1 according to the Embodiment of the present invention.

Outline of Aspects of the Present Invention

An organic light emitting element according to an aspect of the present invention comprises a first electrode formed from a metal alloy that includes a first metal material exhibiting carrier-injection properties upon oxidation and a second metal material that is light-reflective and electrically conductive, a precipitate of the first metal material having been caused to form on at least part of a surface of the first electrode, and a metal oxide layer having formed in the precipitate; a functional layer in contact with the surface of the first electrode and including at least a light-emitting layer configured to accept a carrier injected by the first electrode; and a second electrode disposed opposite the first electrode with the functional layer therebetween and having different polarity than the first electrode.

In the organic light emitting according to the above aspect of the present invention, a precipitate of the first metal material has been caused to form on at least part of a surface of the first electrode, and a metal oxide layer has formed in the precipitate. As described above, the first metal material included in the metal alloy composing the first electrode exhibits carrier-injection properties upon oxidation. Accordingly, the first electrode in the organic light emitting element according to the above aspect of the present invention has carrier-injection properties with respect to the functional layer, and therefore it is not necessary to form a separate carrier-injection layer on the first electrode. Omitting a carrier-injection layer on the first electrode reduces the total number of layers, which is advantageous in terms of cost.

Furthermore, in the organic light emitting element according to the above aspect of the present invention, a metal oxide layer formed in the first electrode and exhibiting carrier-injection properties not only makes it unnecessary to form a separate carrier-injection layer, as described above, but also avoids the problem of reduced light-emitting characteristics caused by the carrier-injection layer in the above conventional technology peeling off.

Accordingly, the organic light emitting element according to the above aspect of the present invention can be manufactured at low cost with excellent light-emitting characteristics.

Note that precipitation refers to the appearance of a phase (precipitate) within a solid solution (base material), the phase having a different crystal structure than the original crystal structure of the solid solution. The precipitate in the above description refers to the appearance of the phase of the first metal material on at least part of the surface of the metal alloy.

In the organic light emitting element according to the above aspect of the present invention, on the surface of the first electrode, along with the metal oxide layer formed in the precipitate of the first metal material, a metal oxide layer may be formed in the second metal material. In other words, in the organic light emitting element according to the above aspect of the present invention, the metal oxide layer on the first metal material and the metal oxide layer on the second metal material may coexist on the surface of the first electrode. With the above structure, even if the metal oxide layer on the second metal material has insulating properties, carriers are still reliably injected into the functional layer, since the metal oxide layer on the first metal material has carrier-injection properties.

In the organic light emitting element according to the above aspect of the present invention, parts of the metal oxide layer formed in the precipitate of the first metal material may be isolated or discontinuous within the metal oxide layer formed in the second metal material. With the above structure, carriers are injected into the functional layer through the metal oxide layer formed in the first metal material on the surface of the first electrode, while guaranteeing the light-reflectivity of the electrically conductive metal in the metal alloy via the metal oxide layer on the second metal material.

In the organic light emitting element according to the above aspect of the present invention, specific examples of the first metal material that exhibits carrier-injection properties upon oxidation are any transition metal of Group 4 to Group 11 of the periodic table and a typical metal of Group 12 of the periodic table. Metal oxides of these materials are semi-conductive. Accordingly, these materials have excellent carrier-injection properties.

In the organic light emitting element according to the above aspect of the present invention, the first electrode may be an anode, the second electrode may be a cathode, and the metal oxide layer formed in the precipitate of the first metal material may have hole-injection properties whereby the first metal oxide layer injects a hole as the carrier.

In the organic light emitting element according to the above aspect of the present invention, the functional layer may include a hole transporting layer configured to transport a hole to the light-emitting layer and in contact with the first electrode. With this structure, excellent hole-injection properties are achieved with respect to the hole transporting layer included in the functional layer.

The organic light emitting element according to the above aspect of the present invention may further comprise: a light emitting cell and a non-light emitting portion, wherein the light emitting cell includes the first electrode, the light-emitting layer, and the second electrode, the non-light emitting portion includes the auxiliary electrode and the second electrode, without including the light-emitting layer, the auxiliary electrode has been formed from the metal alloy that includes the first metal material exhibiting carrier-injection properties upon oxidation and the second metal material that is light-reflective and electrically conductive, a precipitate of the first metal material having been caused to form on at least part of a surface of the auxiliary electrode, and a metal oxide layer having formed in the precipitate, and the second electrode is continuous across the light emitting cell and the non-light emitting portion.

With this structure, the first electrode and the auxiliary electrode have been formed to have the same structure. In other words, both the first electrode and the auxiliary electrode have been formed from the metal alloy that includes the first metal material exhibiting carrier-injection properties upon oxidation and the light-reflective, electrically conductive second metal material. Furthermore, the precipitate of the first metal material has been caused to form on at least part of the surface of both the first electrode and the auxiliary electrode, and the metal oxide layer has formed in the precipitate. With this structure, it is not necessary to provide a separate layer for carrier injection in the light emitting cell, and excellent carrier-injection properties are achieved by the metal oxide layer in the precipitate of the first metal material in the first electrode.

On the other hand, in the non-light emitting portion, no separate layer for carrier injection exists between the auxiliary electrode and the second electrode, which eliminates an increase in contact resistance between the auxiliary electrode and the second electrode caused by such a layer. As a result, the metal oxide layer on the precipitate of the first metal material fulfills the role of guaranteeing an excellent electrical connection exists between the auxiliary electrode and the second electrode.

In the organic light emitting element according to the above aspect of the present invention, a specific example of the first metal material is nickel (Ni), and a specific example of the second metal material is aluminum (Al).

In the organic light emitting element according to the above aspect of the present invention, content of the first metal material in the metal alloy may be in an atomic concentration range of 3.0-5.0 at. %, inclusive. This is because if the content of the first metal material in the metal alloy is smaller than 3.0 at. % (i.e. an atomic concentration of 3.0%), the carrier-injection characteristics may not be sufficient. On the other hand, if the content of the first metal material is larger than 5.0 at. %, it may be difficult to ensure light-reflectivity.

An organic display panel according to an aspect of the present invention is provided with the organic light emitting element according to the above aspect of the present invention. Accordingly, the organic display panel according to the above aspect of the present invention can be manufactured at low cost with excellent light-emitting characteristics for the same reasons as described above.

An organic display device according to an aspect of the present invention is provided with the organic display panel according to the above aspect of the present invention. Accordingly, the organic display device according to the above aspect of the present invention can be manufactured at low cost with excellent light-emitting characteristics for the same reasons as described above.

A method of manufacturing an organic light emitting element according to another aspect of the present invention comprises: a first step of forming a first electrode layer from a metal alloy that includes a first metal material exhibiting carrier-injection properties upon oxidation and a second metal material that is light-reflective and electrically conductive; a second step of heating and applying oxidation treatment to the first electrode layer so that a precipitate of the first metal material forms on at least part of a surface of the first electrode layer and a metal oxide layer forms in the precipitate; a third step of providing a functional layer on the first electrode layer in contact with the surface of first electrode layer, the functional layer including a light-emitting layer configured to accept carriers injected from the first electrode layer; and a fourth step of forming a second electrode above the functional layer, the second electrode having different polarity than the first electrode.

In the method of manufacturing an organic light emitting according to the above aspect of the present invention, a precipitate of the first metal material is caused to form on at least part of a surface of the first electrode layer, and a metal oxide layer forms in the precipitate. The first metal material included in the metal alloy used to form the first electrode layer exhibits carrier injection properties upon oxidation, as described above. Accordingly, in an organic light emitting element manufactured using the method of manufacturing according to the above aspect of the present invention, the first electrode layer has carrier-injection properties with respect to the functional layer, and it is not necessary to form a separate carrier injection layer on the first electrode layer. Omitting a carrier injection layer on the first electrode layer reduces the total number of layers, which is advantageous in terms of cost.

Furthermore, as described above, in the organic light emitting element manufactured using the method of manufacturing according to the above aspect of the present invention, the metal oxide layer in the precipitate of the first metal material in the first electrode layer has carrier-injection properties. These carrier-injection properties not only make it unnecessary to form a separate carrier-injection layer, but also avoid the problem of reduced light-emitting characteristics caused by the carrier-injection layer in the above conventional technology peeling off.

Accordingly, the method of manufacturing an organic light emitting element according to the above aspect of the present invention can be used to manufacture an organic light emitting element at low cost with excellent light-emitting characteristics.

In the method of manufacturing an organic light emitting according to the above aspect of the present invention, in the second step of heating and applying oxidation treatment to the first electrode layer formed in the first step, a metal oxide layer may form in the second metal material along with the metal oxide layer that forms in the precipitate of the first metal material. By thus heating and applying oxidation treatment, the precipitate of the first metal material can be caused to form and oxidize without performing complicated procedures.

In the method of manufacturing an organic light emitting according to the above aspect of the present invention, in the second step of heating and applying oxidation treatment to the first electrode layer formed in the first step, parts of the metal oxide layer that form in the precipitate of the first metal material may be isolated or discontinuous within a metal oxide layer formed in the second metal material. Parts of the metal oxide layer formed in the first metal material are thus isolated or discontinuous within the second metal oxide layer formed in the second metal material. Therefore, in the manufactured organic light emitting element, carriers are injected into the functional layer through the metal oxide layer formed in the first metal material on the surface of the first electrode, while guaranteeing the light-reflectivity and electrical conductivity of the second metal material in the metal alloy via the metal oxide layer in the second metal material.

In the method of manufacturing an organic light emitting according to the above aspect of the present invention, the second step may specifically be heating at a temperature of 230° C. or greater and for a duration of 30 min or longer. With these heating conditions, the precipitate of the first metal material, as well as the metal oxide layer on the precipitate, are formed efficiently. In the manufactured organic light emitting element, excellent carrier-injection properties with respect to the functional layer are thus guaranteed.

The method of manufacturing an organic light emitting according to the above aspect of the present invention may further comprise, between the second step and the third step, the steps of patterning the first electrode layer in which the metal oxide layer forms in the second step; and forming a bank between adjacent sections of the first electrode layer that are pattered so as to partition the sections.

In the method of manufacturing an organic light emitting according to the above aspect of the present invention, the functional layer may include a hole transporting layer configured to transport a hole to the light-emitting layer, the first step of forming the first electrode layer may use material that forms an anode as the second metal material and use material that has hole-injection properties as the first metal material, and the fourth step of forming the second electrode may use material that forms a cathode.

The following describes examples of an Embodiment and Modification of the present invention.

Note that the following Embodiments are simply examples to clearly illustrate a structure of the present invention and the effects and advantages thereof. The present invention is in no way limited to the following Embodiments except in its essential characteristic elements.

Embodiments

1. Overall Structure of the Display Device 1

The organic display device 1 according to the Embodiment is described below with reference to FIG. 1.

As shown in FIG. 1, the organic display device 1 is composed of an organic display panel unit 10 and a drive control unit 20 connected to the organic display panel unit 10. The organic display panel unit 10 is an organic EL panel that uses the phenomenon of electroluminescence occurring in organic light emitting material and is composed of an array of a plurality of organic light emitting elements.

The drive control unit 20 is composed of four drive circuits 21-24 and a control circuit 25.

Note that in an actual display device 1, the placement and relation of connection of the drive control unit 20 with respect to the display panel unit 10 is not limited in this way.

2. Structure of Organic Display Panel 10

Figure 2:
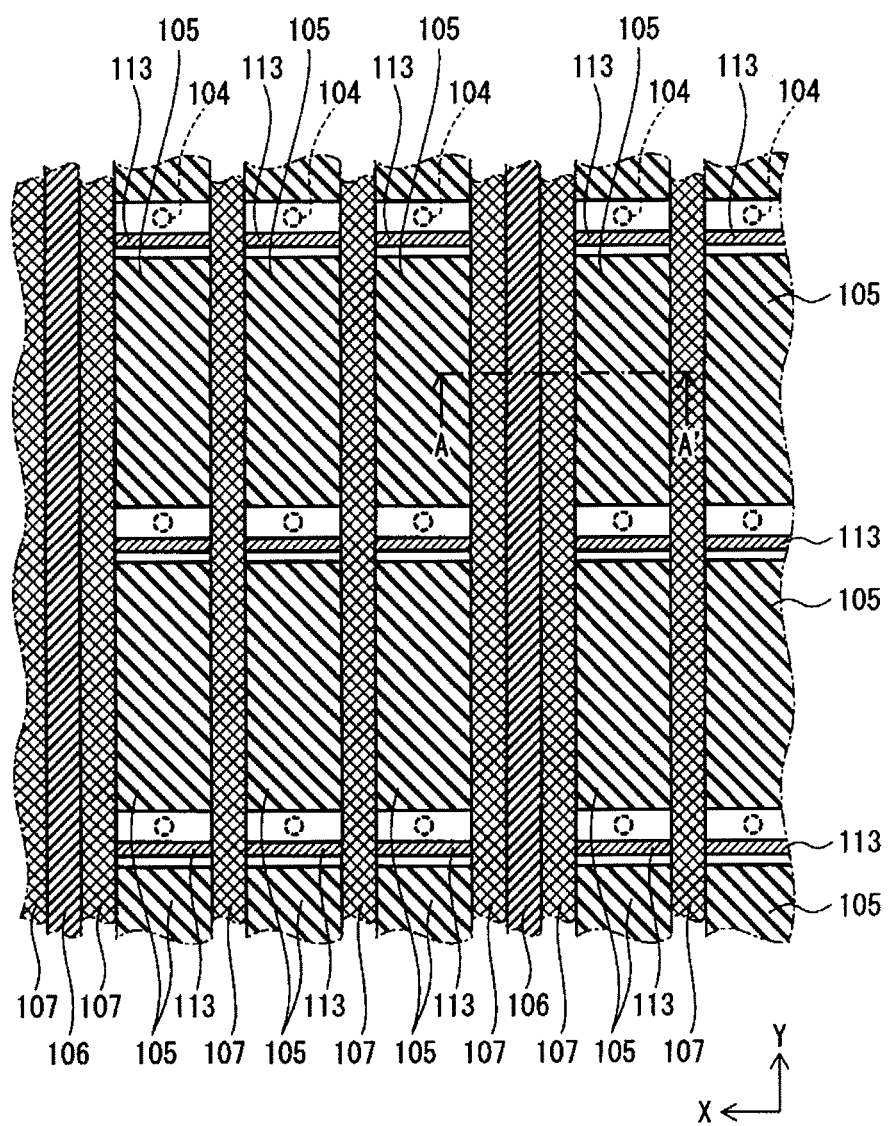
FIG. 2 is a schematic plan view showing the positional relationship between banks 107, anodes 105, and auxiliary electrodes 106 in an organic display panel 10.
Figure 3:
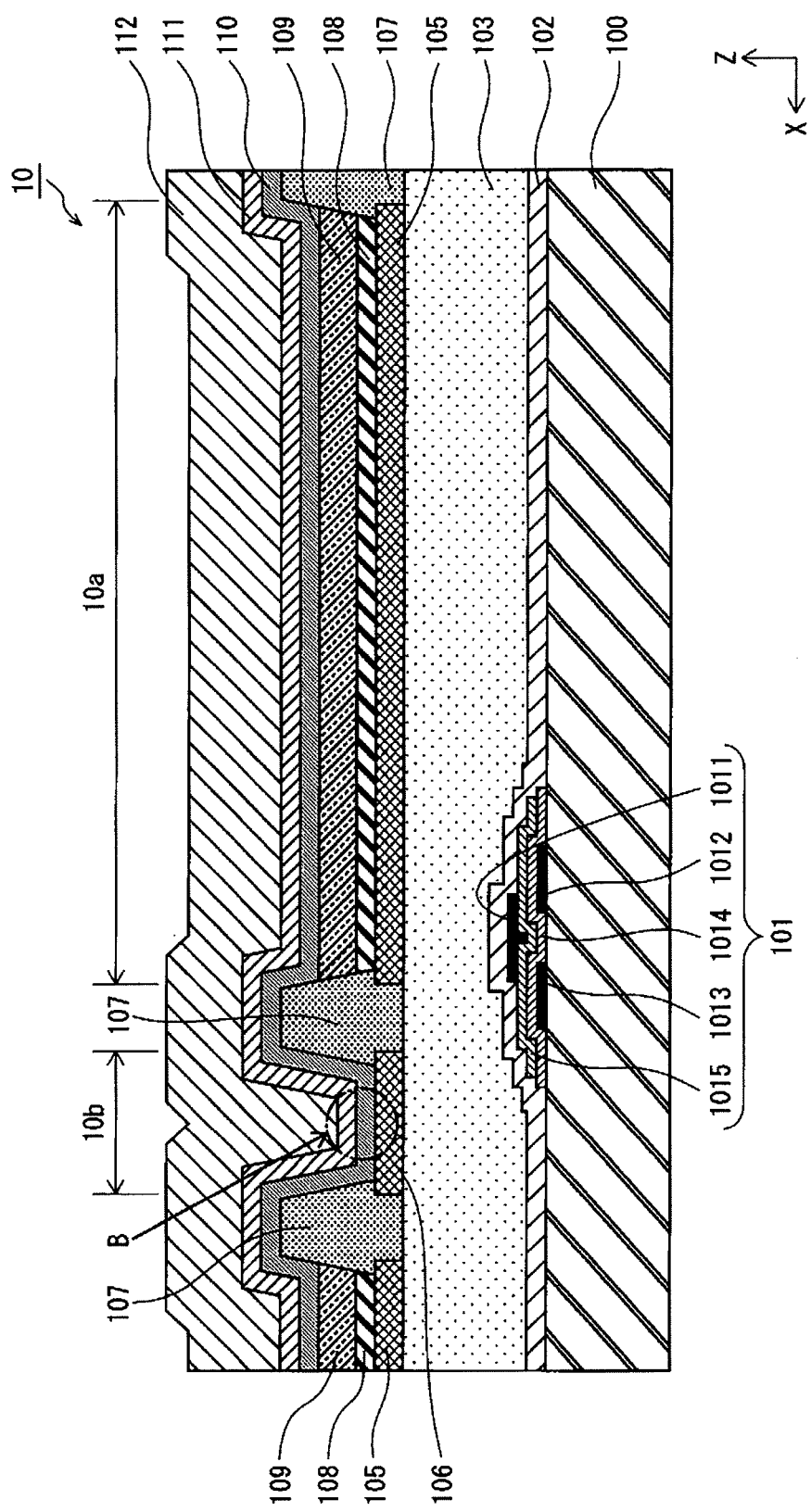
FIG. 3 is a schematic cross-section diagram showing a portion of the organic display panel 10.

The structure of the organic display panel 10 is described with reference to FIGS. 2 and 3. FIG. 2 is a schematic plan view showing the positional relationship between banks 107, anodes 105, and auxiliary electrodes 106 in the organic display panel 10. FIG. 3 is a schematic cross-section diagram showing a portion of the organic display panel 10 from A to A' in FIG. 2.

As shown in FIG. 2, the organic display panel 10 according to the Embodiment has a plurality of banks 107 (line banks) that extend along the Y axis. Between adjacent banks 107, an anode 105 is provided at each section corresponding to a light emitting cell, and an auxiliary electrode 106 is provided at each section corresponding to a non-light emitting portion.

In the organic display panel 10 according to the Embodiment, three sub-pixels (light emitting cells) adjacent along the X axis form one pixel, and an auxiliary electrode 106 is provided for each pixel. Sub-pixels that are adjacent along the Y axis are partitioned by a pixel defining layer 113, and next to each pixel defining layer 113, a contact hole 104 is formed.

Next, as shown in FIG. 3, in the organic display panel 10, a TFT layer 101 and a passivation film 102 are laminated in this order on the upper surface of the substrate 100 in the direction of the Z axis. A planarizing film 103 is further laminated on top of the passivation film 102. In the organic display panel 10, light emitting cells 10a and non-light emitting portions 10b are included in an X-Y plane (see FIGS. 1 and 2). As described above, in the light emitting cells 10a, an anode 105 is formed on the planarizing film 103, and in the non-light emitting portions 10b, an auxiliary electrode 106 is formed on the planarizing film 103. In this Embodiment, the anodes 105 and auxiliary electrodes 106 are formed from the same material to the same film thickness.

The TFT layer 101 is composed of a gate electrode 1011, drain electrode 1012, source electrode 1013, channel layer 1014, and gate insulation film 1015, and the contact hole 104 is connected with the anode 105 (connection not shown in FIG. 3).

A bank 107 is provided between adjacent anodes 105, as well as between an adjacent anode 105 and auxiliary electrode 106. The banks 107 are formed to overlap the edges of the anodes 105 and the auxiliary electrodes 106.

In the light emitting cells 10a, an interlayer 108, organic light emitting layer 109, electron transport layer 110, and cathode 111 are laminated in this order above the anode 105. The electron transport layer 110 is formed continuously across each non-light emitting portion 10b, passing over the banks 107, as is also the case with the cathode 111. Therefore, the organic light emitting layer 109 is not laminated on the auxiliary electrode 106, whereas the electron transport layer 110 and cathode 111 are laminated in this order. As a result of this structure, the cathode 111 and the auxiliary electrode 106 are electrically connected with the electron transport layer 110 therebetween (see the portion indicated by arrow B).

The upper surface of the cathode 111 is covered by a passivation layer 112.

The following are examples of structural materials used in the organic display panel 10.

a) Substrate 100

The substrate 100 is formed with a base of an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, etc.

b) Planarizing Film 103

The planarizing film 103 is formed with an organic insulating material, such as acrylic, polyimide, or sol-gel, or an inorganic insulating material such as SiN or $SiO_X$.

c) Anode 105 and Auxiliary Electrode 106

The anode 105 and auxiliary electrode 106 are formed with a metal alloy of aluminum that includes nickel (Ni). Nickel is a transition metal material that belongs to Group 10 of the periodic table. Upon oxidation, nickel exhibits semiconducting properties and thus has hole-injection properties. On the other hand, aluminum is an electrically conductive, light-reflective metal.

A nickel precipitate has formed on at least part of the surface of the anode 105 and the auxiliary electrode 106. The surface of nickel precipitate has oxidized, yielding a nickel oxide layer. This structure is described below.

d) Banks 107

The banks 107 are formed with an organic material, such as resin, and have insulating properties. Examples of the organic material used to form the banks 107 include acrylic resin, polyimide resin, styrenic resin, polycarbonate resin, novolac-type phenolic resin, etc. It is preferable that the banks 107 have organic solvent resistance. Furthermore, since the banks 107 may undergo processes such as etching, baking, etc. when formed, it is preferable that the banks 107 be formed from highly resistant material that will not change excessively in shape or quality during such processes. To provide the banks 107 with liquid repellency, the surface thereof can be fluoridated.

Note that as the insulating material used in forming the banks 107, any liquid repellent material with a resistivity of $10^5$ Ω·cm or greater can be used, starting with the above materials. Using a material with a resistivity of $10^5$ Ω·cm or less leads to production of leak current between the anodes 105 and the cathode 111, or between adjacent sub-pixels, due to the banks 107. Such leak current causes a variety of problems such as increased power consumption.

The structure of the banks 107 need not be a single layer as shown in FIG. 3, but may adopt a two or more layered structure. In such a case, the above materials may be combined for each layer, or layers may alternate between non-organic and organic material.

e) Interlayer 108

The interlayer 108 is formed from a polymer not containing a hydrophilic group. For example, a polymer such as polyfluorene or a derivative thereof, or polyarylamine or a derivative thereof, that does not contain a hydrophilic group is used.

f) Organic Light Emitting Layer 109

The organic light emitting layer 109 has a function of emitting light when an excitation state is produced by the recombination of holes with electrons. The material used to form the organic light emitting layer 109 needs to be a light emitting organic material, a film of which can be formed by wet printing.

Specifically, it is preferable that the organic light emitting layer 106 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

g) Electron Transport Layer 110

The electron transport layer 110 has a function to transport electrons injected through the cathode 111 to the organic light emitting layer 109 and is formed, for example, from one of the following materials.

Examples of the material used to form the electron transport layer 110 include an oxadiazole derivative, benzoquinone or a derivative thereof, anthraquinone or a derivative thereof, a metal complex of a 8-hydroxyquinoline compound or a derivative thereof, polyquinoline or a derivative thereof, polyquinoxaline or a derivative thereof, or polyfluorene or a derivative thereof.

h) Cathode 111

The cathode 111 is formed, for example, of ITO, indium zinc oxide (IZO), etc. In the case of a top-emission type organic display panel 10, it is preferable to use a transparent material such as the transparent materials listed above. It is preferable that the degree of transparency be 80% or greater.

The material used to form the cathode 111 may, in addition to the above materials, be for example an alkali metal or alkali earth metal, or a laminate structure having, in the following order, a layer that includes a halide of an alkali metal or alkali earth metal and a layer that includes silver. The layer that includes silver may be formed with silver alone, or with a silver alloy. Also, in order to increase light takeoff efficiency, a highly transparent refraction index adjustment layer may be provided above the layer that includes silver.

i) Passivation Layer 112

The passivation layer 112 has the function of controlling the organic light emitting layer 109 or other layers from being exposed to water or air and is formed, for example, with silicon nitride (SiN), silicon oxynitride (SiON), etc. In the case of the top-emission type panel, it is preferable that the passivation layer 112 be formed with a transparent material.

3. Structure of Anode 105

The structure of the anode 105 is described with reference to FIG. 4. FIG. 4 focuses on the anode 105 in the organic display panel 10 shown in FIG. 3 and on a surrounding area.

As described above, the anode 105 is composed of an alloy that includes nickel as a first metal material and aluminum as a second metal material. As shown in FIG. 4, nickel precipitates on the upper surface (nickel precipitate 1051), in the direction of the Z axis, of an aluminum (Al) layer 1050.

The nickel used as the first metal material in the anode 105 exhibits hole-injection properties upon oxidation. The aluminum used as the second metal material in the anode 105 is light-reflective and electrically conductive.

The nickel precipitate 1051 has not formed on the entire upper surface, in the direction of the Z axis, of the anode 105, but rather has formed on portions of the upper surface. A nickel oxide layer 1053 has formed on the upper surface of the nickel precipitate 1051.

An aluminum oxide layer 1052 has formed on the surface of the aluminum layer 1050 at portions where the nickel precipitate 1051 does not exist.

While not shown in FIG. 4, parts of the nickel oxide layer 1053 along the upper surface, in the direction of the Z axis, of the anode 105 have an isolated or discontinuous distribution in the aluminum oxide layer 1052.

As shown in FIG. 4, an interlayer 108 is laminated on the anode 105 in the organic display panel 10, with no other hole-injection layer therebetween. In the organic display panel 10, the nickel oxide layer 1053 formed on the surface of the nickel precipitate 1051 has hole-injection properties. The anode 105 thus has hole-injection properties.

Note that if the content of nickel in the metal alloy forming the anode 105 is smaller than 3.0 at. % (i.e. an atomic concentration of 3.0%), the hole-injection properties may not be sufficient. On the other hand, if the content of nickel is larger than 5.0 at. %, it may be difficult to ensure that the anode 105 is light-reflective.

Accordingly, the content of nickel in the metal alloy forming the anode 105 is preferably in a range of 3.0 at. % to 5.0 at. %, inclusive.

Note the metal alloy may be a two-component alloy composed of nickel and aluminum or a three-component alloy composed of nickel, aluminum, and a minute quantity of another component. The metal alloy may also include a negligible amount of an impurity. In all of these cases, it is preferable that, in addition to the content of nickel being in a range of 3.0-5.0 at. %, inclusive, the content of aluminum be in a range of 94-96 at. % inclusive.

4. Advantageous Effects

As shown in FIGS. 3 and 4, in the organic display panel 10 according to the Embodiment, the nickel precipitate 1051 has formed on at least part of the surface of the anode 105 in the light emitting cell 10*a*, and a nickel oxide layer 1053 has formed on the upper surface of the nickel precipitate 1051.

As described above, the nickel oxide layer 1053 is a transition metal oxide layer exhibiting hole-injection properties. These properties have been confirmed in the following reference literature, for example.

Reference Literature: Enhanced hole-injections in organic light-emitting devices by depositing nickel oxide on indium tin oxide anode, I-Min Chan, Tsung-Yi Hsu, and Franklin C. Hong, "2002 American Institute of Physics, Applied Physics Letters, volume 81, number 10".

Accordingly, in the organic display panel 10 according to the Embodiment and the organic display device 1 provided with the organic display panel 10, the anode 105 has carrier-injection properties with respect to the organic light emitting layer 109, and therefore it is not necessary to form a separate hole-injection layer on the anode 105. Omitting a hole-injection layer on the anode 105 reduces the total number of layers in the organic display panel 10, which is advantageous in terms of cost.

Furthermore, as described above, in the organic display panel 10 according to the Embodiment, the nickel oxide layer 1053 in the anode 105 has hole-injection properties. It is therefore unnecessary to form a separate hole-injection layer, which avoids the problem of reduced light-emitting characteristics caused by the hole-injection layer in the above conventional technology peeling off.

Accordingly, the organic display panel 10 according to the Embodiment and the organic display device 1 in which the organic display panel 10 is provided can be manufactured at low cost with excellent light-emitting characteristics.

Figure 9:
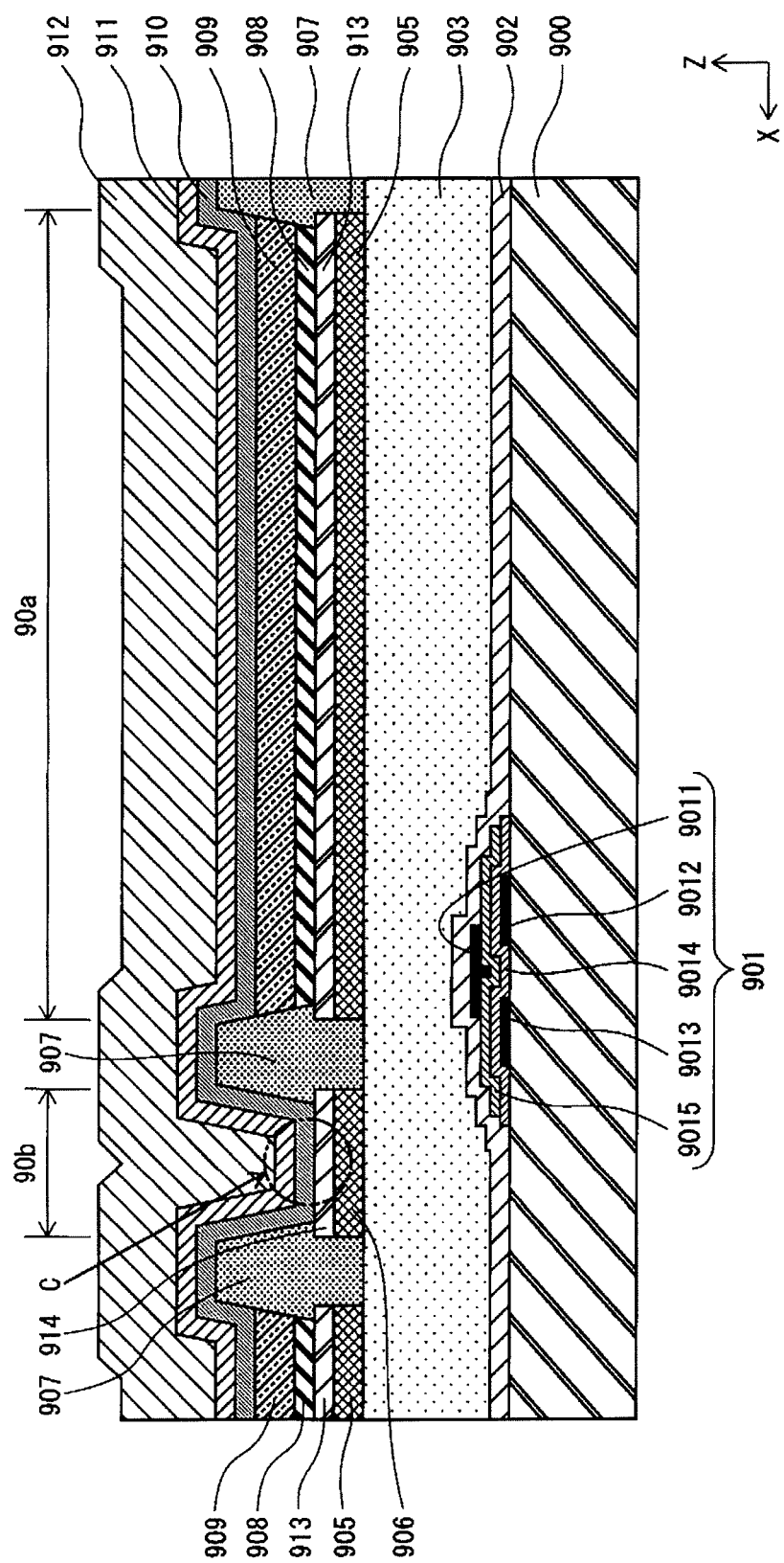
FIG. 9 is a schematic cross-section diagram showing a portion of an organic display panel according to conventional technology.

As shown by the portion indicated by arrow B in FIG. 3, in the non-light emitting portions 10*b* of the organic display panel 10, an interlayer 110 exists between the auxiliary electrode 106 and the cathode 111, whereas no hole-injection layer exists therebetween, unlike the organic display panel according to conventional technology as shown in FIG. 9. Accordingly, in the organic display panel 10 according to the Embodiment, a reduction in contact resistance can be achieved by the lack of a hole-injection layer between the auxiliary electrode 106 and the cathode 111 in the non-light emitting portion 10*b*.

As in the anode 105 shown in FIG. 4, nickel has precipitated to the surface in the auxiliary electrode 106 as well, and the surface of the nickel precipitate has oxidized to form a nickel oxide layer. Accordingly, an excellent electrical connection exists between the auxiliary electrode 106 and the electron transport layer 110.

5. Manufacturing Method

A manufacturing method of the organic display panel 10 is described with reference to FIGS. 5 through 7.

Figure 5A:
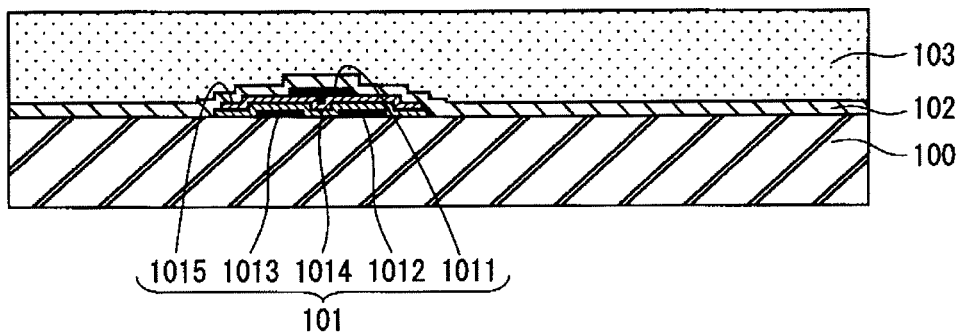
FIG. 5 is a schematic cross-section diagram showing a process of manufacturing the organic display panel 10.

As shown in FIG. 5A, the drain electrode 1012 and source electrode 1013 are formed on the main upper surface, in the direction of the Z axis, of the substrate 100. The channel layer 1014, gate insulation film 1015, and gate electrode 1011 are formed in this order, covering the drain electrode 1012 and source electrode 1013, in order to form the TFT layer 101. Subsequently, after forming the passivation film 102 via a coating process, the planarizing film 103 is formed using an inorganic material (such as SiN or $SiO_X$) or an organic material (such as acrylic, polyimide, sol-gel, etc.).

Figure 5B:
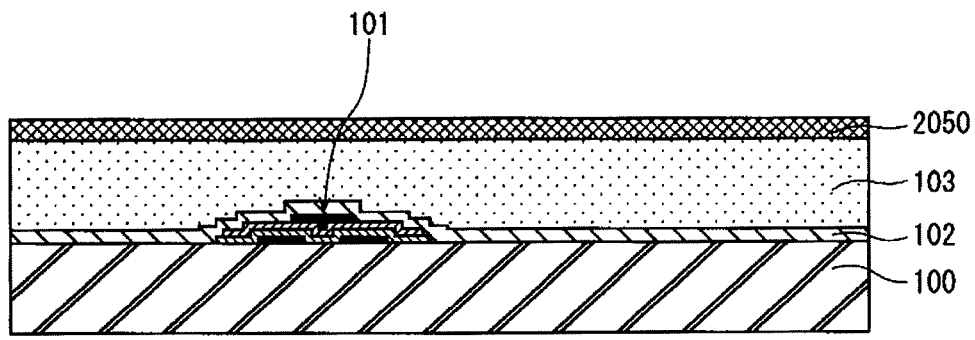

Next, as shown in FIG. 5B, a metal alloy film 2050 is deposited on the surface of the planarizing film 103. The metal alloy film 2050 is deposited via sputtering, for example, using a metal alloy of aluminum that includes at least nickel (Ni).

Figure 5C:
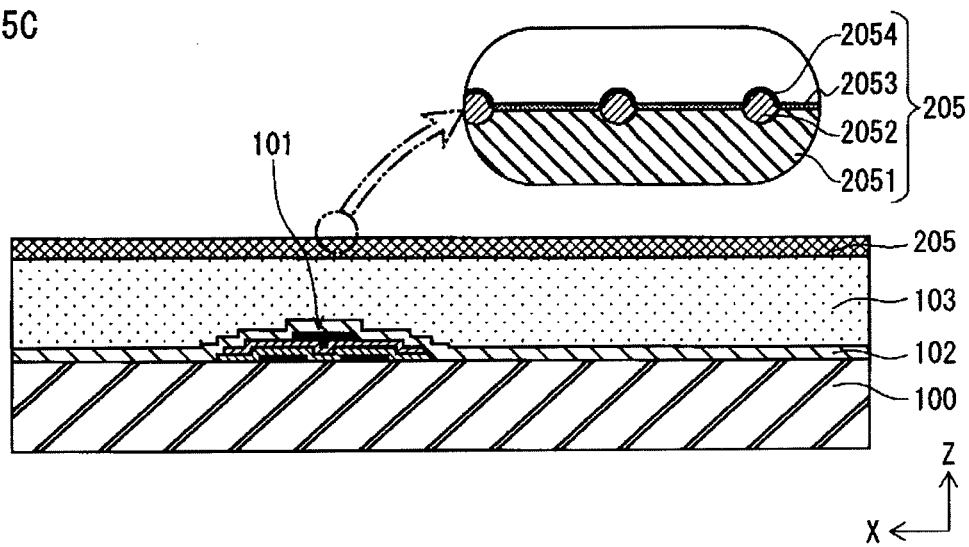

Next, as shown in FIG. 5C, the metal alloy film 2050 formed on the planarizing film 103 is baked in an oxygen ($O_2$) atmosphere. Conditions for baking are a temperature of 230° C. or greater and a duration of 30 min or longer. By baking the metal alloy film 2050 under these conditions, a nickel precipitate 2052 forms on part of the surface of the aluminum layer 2051, as shown by the portion in FIG. 5C encircled by a line with alternate long and two short dashes. The surface of the nickel precipitate 2052 oxidizes, forming a nickel oxide layer 2054. The surface of the aluminum layer 2051 also oxidizes, forming an aluminum oxide layer 2053. A post-baking metal alloy film 205 is thus complete.

Figure 6A:
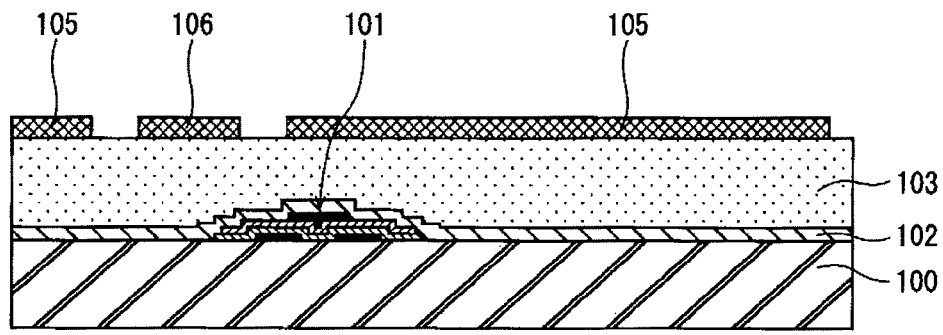
FIG. 6 is a schematic cross-section diagram showing the process of manufacturing the organic display panel 10.

Next, as shown in FIG. 6A, the metal alloy film 205 is patterned via photolithography and etching to form the anodes 105 and the auxiliary electrodes 106. The nickel precipitate 1051 and nickel oxide layer 1053 are formed on the upper surface, in the direction of the Z axis, of each of the anodes 105 and the auxiliary electrodes 106 (see FIG. 4). Note that either wet etching or dry etching may be used for the etching during the patterning. When wet etching is used, dilute hydrofluoric acid or the like may for example be used as the etchant. When dry etching is used, $CF_4$ or the like may for example be used as the etching gas.

Next, one layer composed of bank material is formed above all of the anodes 105 and auxiliary electrodes 106 formed by patterning, the layer also covering the entire surface of the planarizing film 103 exposed between the anodes 105 and auxiliary electrodes 106. The layer may be formed with an insulating material such as acrylic resin, polyimide resin, novolac-type phenolic resin, etc., via spin coating or another method.

Figure 6B:
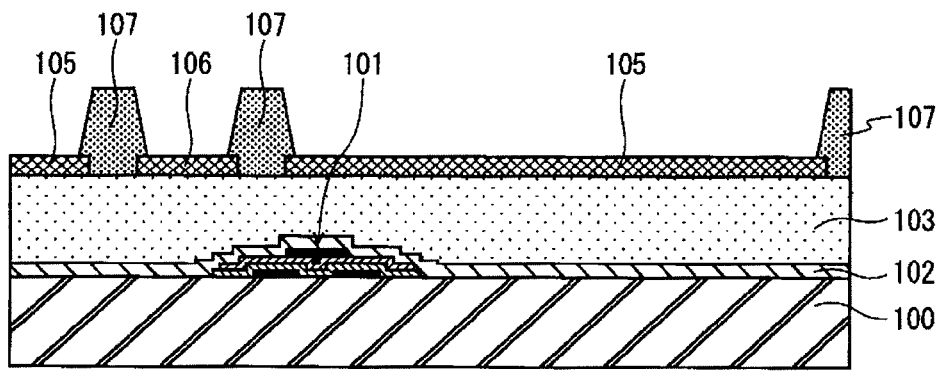

By exposing and developing the layer composed of bank material, banks 107 are formed, as shown in FIG. 6B, between adjacent anodes 105, and between an adjacent anode 105 and auxiliary electrode 106. The banks 107 at this point are formed to partially overlap the edges of the anodes 105 and the auxiliary electrodes 106.

Figure 6C:
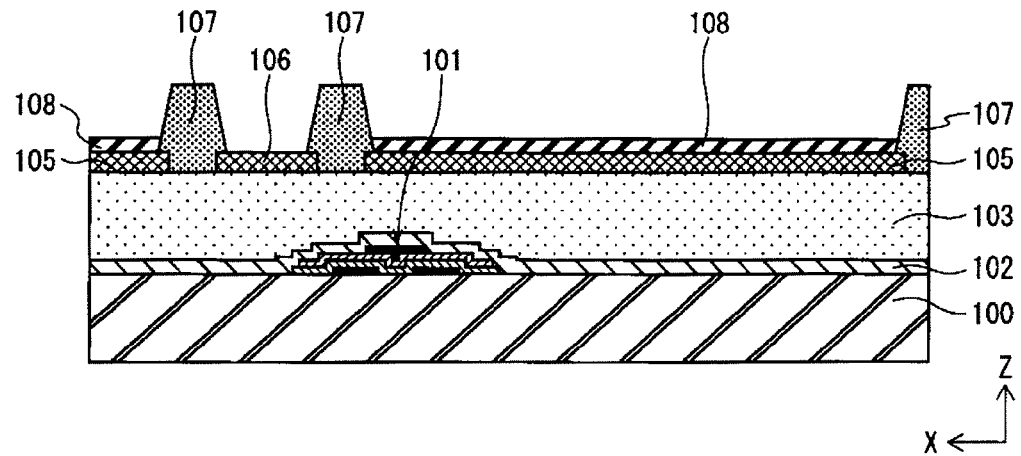

Next, as shown in FIG. 6C, in the light emitting cells 10*a* (see FIG. 3) partitioned by the banks 107, the interlayer 108 is laminated on the anode 105. As described above, a polymer not containing a hydrophilic group may be used to form the interlayer 108.

Figure 7A:
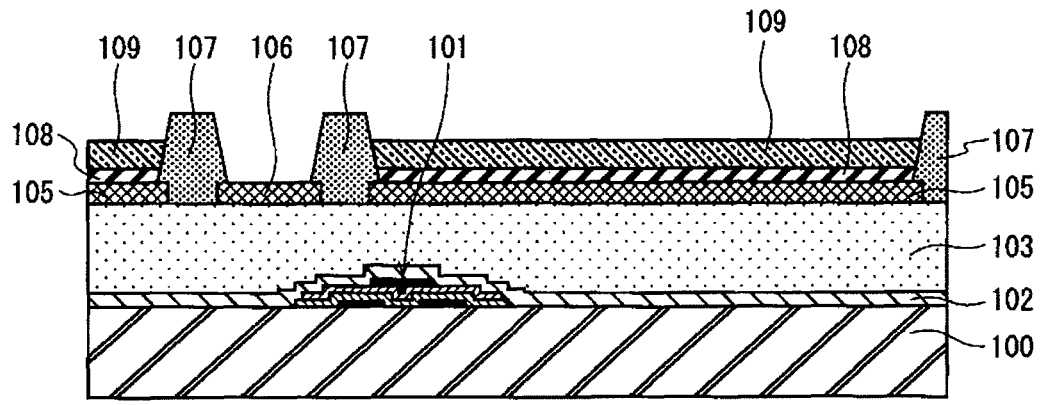
FIG. 7 is a schematic cross-section diagram showing the process of manufacturing the organic display panel 10.

Next, ink containing organic light emitting material is dripped, for example via the inkjet method or other method, on the interlayer 108. The dripped ink is dried to form the organic light-emitting layers 109 as shown in FIG. 7A. Note that the organic light emitting layers 109 are formed so that adjacent sub-pixels have different luminescent colors, such as red (R), green (G), and blue (B).

Figure 7B:
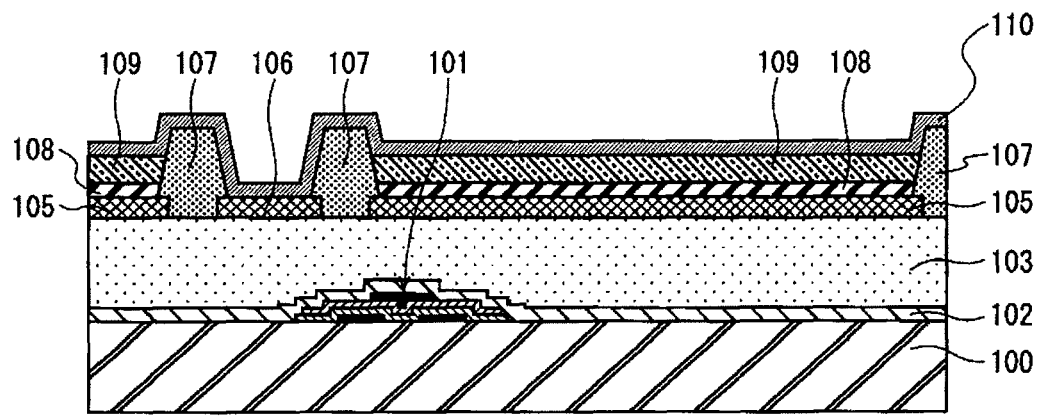
Figure 7C:
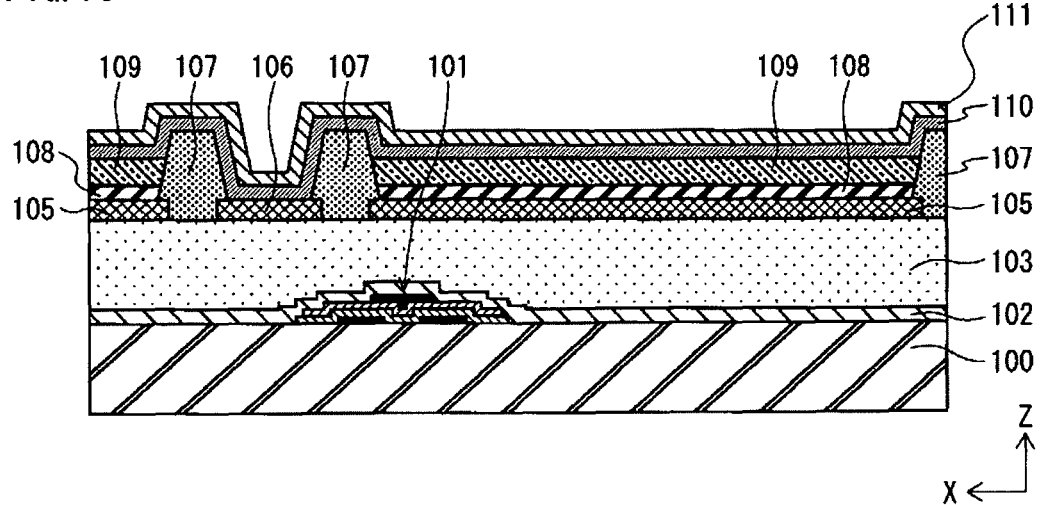

Next, as shown in FIG. 7B, on the entire surface of the organic light emitting layers 109, banks 107, and auxiliary electrodes 106, an electron transport layer 110 is formed. Thereafter, a cathode 111 is formed on the electron transport layer 110, as shown in FIG. 7C.

While not shown in the figures, a passivation layer 112 is formed on the cathode 111 to complete the organic display panel 10 shown in FIG. 3.

As compared to manufacturing the conventional organic display panel shown in FIG. 9, when manufacturing the organic display panel in the Embodiment via the above manufacturing method, the manufacturing process is simplified since a separate hole-injection layer is not necessary, thus reducing manufacturing cost.

Furthermore, the organic display panel 10 manufactured via the method in the Embodiment achieves the above advantageous effects.

Modification

The structure of an organic display panel according to a Modification is described with reference to FIG. 8.

Figure 8:
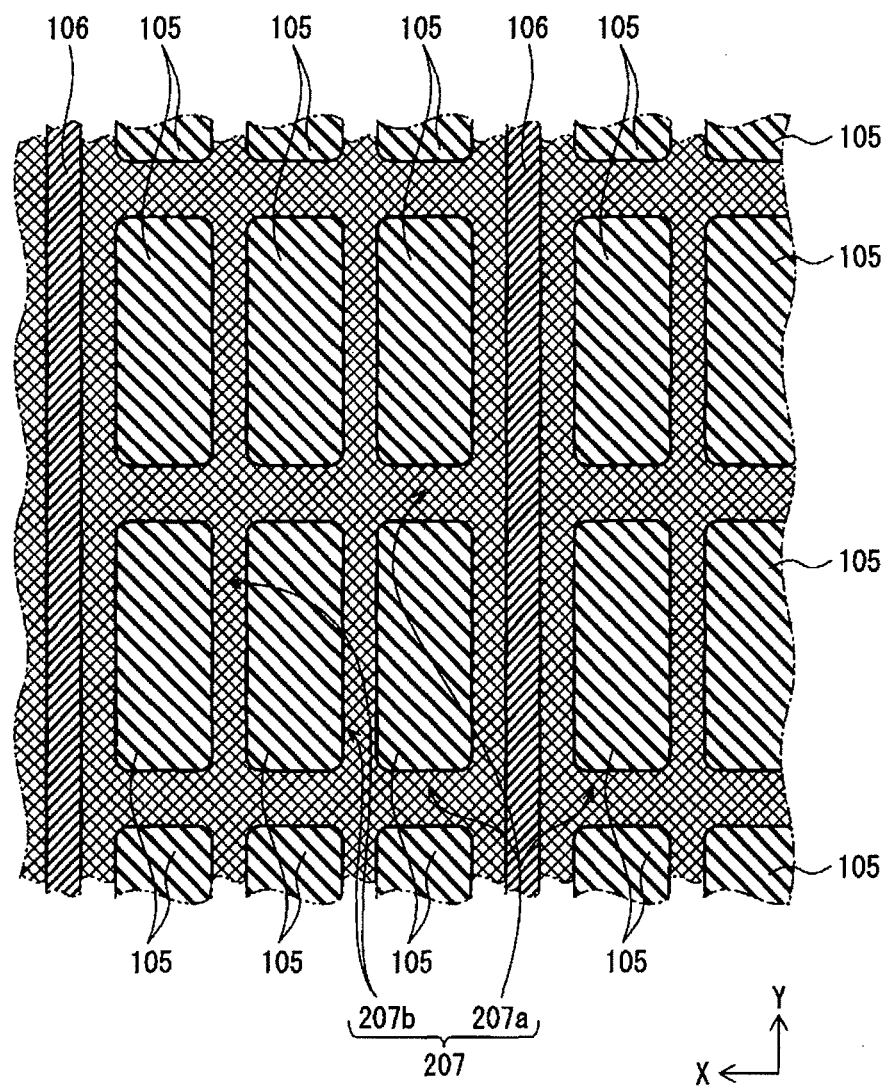
FIG. 8 is a schematic plan view showing the positional relationship between banks 207, anodes 105, and auxiliary electrodes 106 in a Modification of the organic display panel.

As shown in FIG. 8, the organic display panel according to the Modification differs from the organic display panel 10 according to the Embodiment in terms of the structure of the banks 207. Otherwise, the structures of the organic display panels are the same.

In the banks 207 in the organic display panel according to the Modification, portions 207a extending in the direction of the X axis and portions 207b extending in the direction of the Y axis are both formed integrally. That is, the banks 207 are pixel banks. In the organic display panel according to the Modification, sub-pixels that are adjacent in the direction of the X axis are partitioned by the portions 207b, and sub-pixels that are adjacent in the direction of the Y axis are partitioned by the portions 207a. In the windows defined by the banks 207, the anode 105 corresponding to each sub-pixel and the auxiliary electrode 106 provided for each pixel are exposed.

The structures of the anodes 105 and the auxiliary electrodes 106 are the same in the organic display panel according to the Modification as in the Embodiment, as are other structures apart from the structure of the banks 207. Therefore, the organic display panel according to the modification has the same advantageous effects as the organic display panel 10 according to the Embodiment.

Other Considerations

In the organic display panel 10 according to the Embodiment and the organic display panel according to the Modification, anodes 105 are provided above the planarizing film 103. Conversely, however, a cathode may be provided above the planarizing film 103. In this case, the same advantageous effects as above can be achieved by adopting a structure as in FIG. 4 with respect to the cathode.

In the organic display panel 10 according to the Embodiment and the organic display panel according to the Modification, an auxiliary electrode 106 is provided for each pixel. Depending on pixel size, however, auxiliary electrodes may not be necessary. In other words, in a small panel, a voltage drop in the central region of the panel may not be problematic, and in such a case, it is not necessary to provide auxiliary electrodes. Even when auxiliary electrodes are provided, it is not necessary to provide one auxiliary electrode for every three sub-pixels. The arrangement of auxiliary electrodes may be determined taking into consideration factors such as panel size and the amount of voltage drop.

In the organic display panel 10 according to the Embodiment and the organic display panel according to the Modification, the base material for the anodes 105 and the auxiliary electrodes 106 is a metal alloy of aluminum (Al) that includes nickel (Ni), but the metal alloy may optionally be changed. It is however necessary to use, as the base material, a metal alloy of an electrically conductive, light-reflective metal. It is further necessary that the metal alloy include a metal that exhibits carrier-injection properties upon oxidation and that precipitates on part of the surface of the metal alloy, with an oxidized layer forming on the surface of the precipitate.

Instead of using Nickel (Ni) as the first metal material in the anodes 105 as in the Embodiment, any of the transition metals of Group 4 to Group 11 of the periodic table may be used, as may a typical metal of Group 12 or other such metal.

In the manufacturing method in the Embodiment, after baking in an oxygen ($O_2$) atmosphere, the metal alloy film 2050 is pattered to form the anodes 105 and the auxiliary electrodes 106. Alternatively, the metal alloy film 2050 may be baked in the oxygen ($O_2$) atmosphere after patterning.

Furthermore, if the baking temperature rises, the amount of metal (nickel) that precipitates increases. Therefore, the baking conditions may be modified to improve electrical conductivity and carrier-injection properties. It is, however, necessary to take the light-reflectivity of the anodes into consideration.

INDUSTRIAL APPLICABILITY

The present invention is useful for achieving an organic light emitting element that can be manufactured at low cost with excellent light-emitting characteristics and a manufacturing method of the same, as well as an organic display panel and organic display device that incorporate the organic light emitting element.

What is claimed is:

1. An organic light emitting element, comprising:
a first electrode formed from a metal alloy, the metal alloy including a first metal material that exhibits a carrier-injection property upon oxidation and a second metal material that is light-reflective and electrically conductive, a precipitate of the first metal material being formed on at least a part of a surface of the first electrode, a metal oxide layer being formed on the precipitate;
a functional layer that contacts the surface of the first electrode and includes at least a light-emitting layer configured to accept a carrier injected by the first electrode; and
a second electrode disposed opposite the first electrode with the functional layer therebetween and having a polarity different from a polarity of the first electrode,
wherein the precipitate of the first metal material is discontinuously formed on the surface of the first electrode in a predetermined direction.

2. The organic light emitting element of claim 1, wherein, on the surface of the first electrode, a second metal oxide layer is formed of the second metal material.

3. The organic light emitting element of claim 2, wherein a discontinuous parts of the precipitate of the first metal material in the predetermined direction are each isolated within the second metal oxide layer formed of the second metal material.

4. The organic light emitting element of claim 3, wherein the first metal material comprises one of any transition metal of Group 4 to Group 11 of the periodic table, and a typical metal of Group 12 of the periodic table.

5. The organic light emitting element of claim 3, wherein the first electrode comprises an anode, the second electrode comprises a cathode, and the metal oxide layer formed on the precipitate of the first metal material has a hole-injection property whereby the metal oxide layer injects a hole as the carrier.

6. The organic light emitting element of claim 2, wherein the first metal material comprises one of any transition metal of Group 4 to Group 11 of the periodic table, and a typical metal of Group 12 of the periodic table.

7. The organic light emitting element of claim 6, wherein the functional layer includes a hole transporting layer configured to transport a hole to the light-emitting layer, the functional layer being in contact with the first electrode.

8. The organic light emitting element of claim 2, wherein the first electrode comprises an anode, the second electrode comprises a cathode, and the metal oxide layer formed on the precipitate of the first metal material has a hole-injection property whereby the metal oxide layer injects a hole as the carrier.

9. The organic light emitting element of claim 1, wherein the first metal material comprises one of any transition metal of Group 4 to Group 11 of the periodic table, and a typical metal of Group 12 of the periodic table.

10. The organic light emitting element of claim 9, wherein the first electrode comprises an anode, the second electrode comprises a cathode, and the metal oxide layer formed on the precipitate of the first metal material has a hole-injection property whereby the metal oxide layer injects a hole as the carrier.

11. The organic light emitting element of claim 1, wherein the first electrode comprises an anode, the second electrode comprises a cathode, and the metal oxide layer formed on the precipitate of the first metal material has a hole-injection property whereby the metal oxide layer injects a hole as the carrier.

12. The organic light emitting element of claim 1, further comprising:
   a light emitting cell; and
   a non-light emitting portion, wherein
   the light emitting cell includes the first electrode, the light-emitting layer, and the second electrode,
   the non-light emitting portion includes an auxiliary electrode and the second electrode, without including the light-emitting layer,
   the auxiliary electrode is formed from the metal alloy including the first metal material that exhibits the carrier-injection property upon oxidation and the second metal material that is light-reflective and electrically conductive, the precipitate of the first metal material is formed on at least part of a surface of the auxiliary electrode, and the metal oxide layer is formed on the precipitate, and
   the second electrode is continuous across the light emitting cell and the non-light emitting portion.

13. The organic light emitting element of claim 1, wherein the first metal material comprises nickel, and the second metal material comprises aluminum.

14. The organic light emitting element of claim 1, wherein a content of the first metal material in the metal alloy is substantially in an atomic concentration range of 3.0-5.0 at. %, inclusive.

15. An organic display panel provided with the organic light emitting element according to claim 1.

16. An organic display device provided with the organic display panel of claim 15.

* * * * *